United States Patent [19]
Morris

[11] Patent Number: 5,334,885
[45] Date of Patent: Aug. 2, 1994

[54] AUTOMATIC CONTROL OF BUFFER SPEED

[75] Inventor: Bernard L. Morris, Allentown, Pa.

[73] Assignee: AT&T Bell Laboratories, Murray Hill, N.J.

[21] Appl. No.: 3,751

[22] Filed: Jan. 13, 1993

[51] Int. Cl.⁵ .................... H03K 17/16; H03K 19/092
[52] U.S. Cl. .................................. 307/443; 307/475; 307/296.8
[58] Field of Search .................... 307/443, 296.8, 451, 307/475

[56] References Cited

U.S. PATENT DOCUMENTS

| | | | |
|---|---|---|---|
| 4,691,127 | 9/1987 | Huizer | 307/443 |
| 4,823,029 | 4/1989 | Gabara | 307/443 |
| 4,959,563 | 9/1990 | Schneck | 307/448 |
| 4,968,902 | 11/1990 | Jackson | 307/443 |
| 4,972,101 | 11/1990 | Partovi et al. | 307/443 |
| 4,975,598 | 12/1990 | Borkar | 307/443 |
| 4,992,753 | 2/1991 | Jensen et al. | 130/129 |
| 5,017,807 | 5/1991 | Kriz et al. | 307/443 |
| 5,095,231 | 3/1992 | Sartori et al. | 307/451 |
| 5,111,081 | 5/1992 | Atallah | 307/443 |

FOREIGN PATENT DOCUMENTS

| | | | |
|---|---|---|---|
| 0184875 | 6/1986 | European Pat. Off. | H03K 19/003 |
| 0264470 | 4/1988 | European Pat. Off. | H03K 6/04 |
| 4051712 | 2/1992 | Japan | H03K 19/0175 |

OTHER PUBLICATIONS

1991 Symposium on VLSI Circuits, Digest of Technical Papers, May 30, 1991, OISO pp. 51–52 H. Partovi et al: Noise Supression Techniques for Logic and Memory Circuits.

*Primary Examiner*—Edward P. Westin
*Assistant Examiner*—Richard Roseen
*Attorney, Agent, or Firm*—James H. Fox

[57] ABSTRACT

The number of active switching elements in a buffer is automatically varied to compensate for variations in the manufacturing process, operating temperature, and power supply voltage. For this purpose, a reference voltage which is proportional to the speed of a switching transistor is applied to an analog-to-digital (A/D) converter. The A/D converter may be implemented with a simple resistor divider and comparators, all of which can be made on-chip. The resistor dividers are chosen such that at worst-case slow conditions all the comparators have high outputs. As the process/temperature/voltage changes, the reference voltage also increases. This successively turns off sections of the switching transistor, thereby slowing down the response of the buffer. Since the control leads are digital, they are not susceptible to noise as they are routed around a chip full of noisy signals. The digital control signals may be latched, and the control circuitry powered down to zero for powersensitive applications.

15 Claims, 2 Drawing Sheets

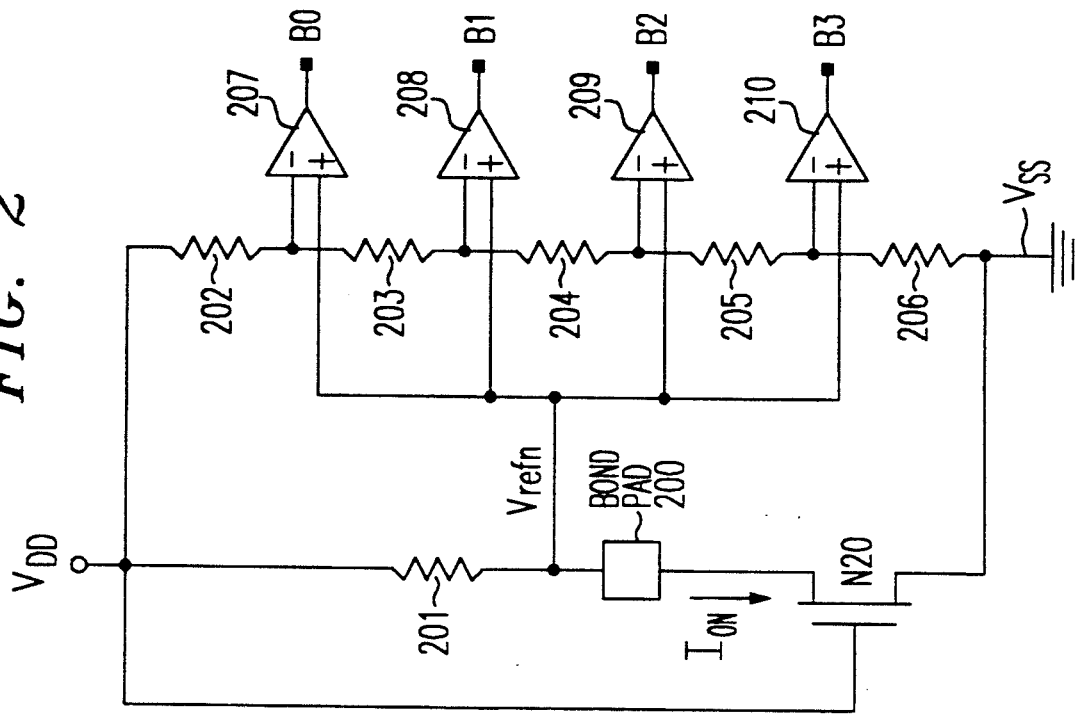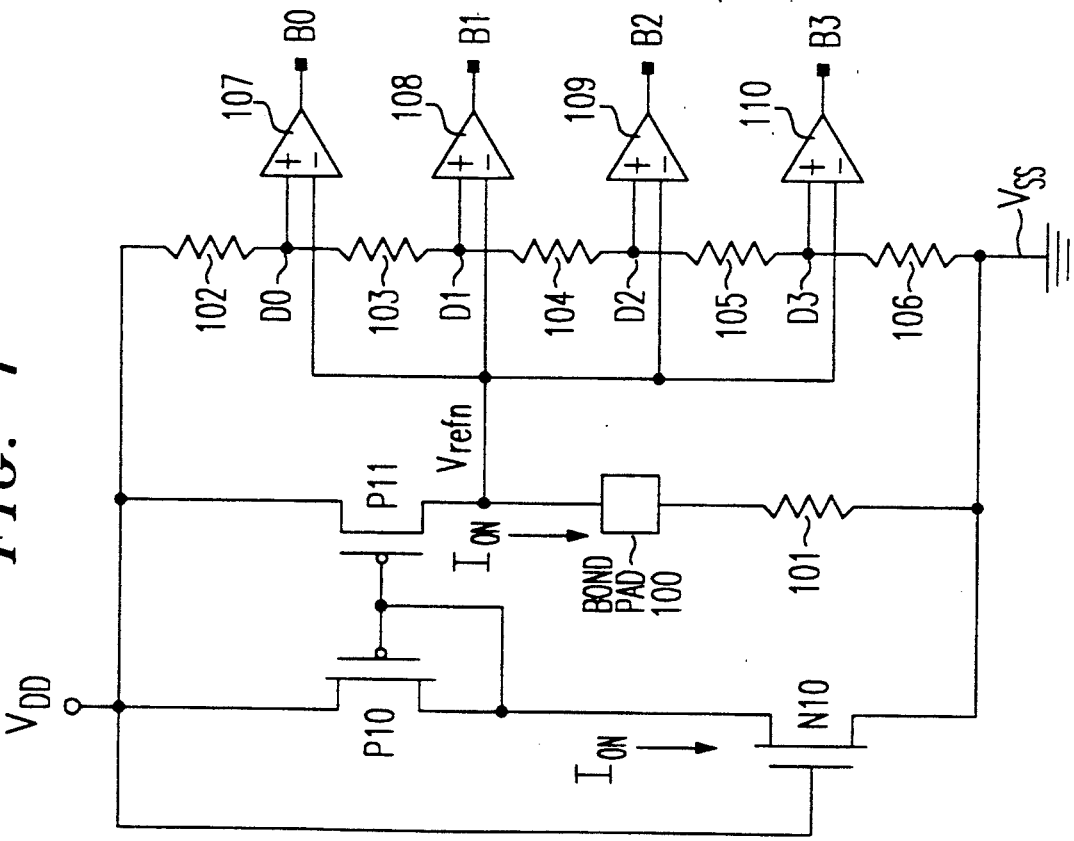

AUTOMATIC CONTROL OF BUFFER SPEED

BACKGROUND OF THE INVENTION

1. Field of the Invention

The present invention relates to integrated circuits having buffers for driving external or internal loads.

2. Description of the Prior Art

Integrated circuits have variations in operating speed due to various factors, including variations in the manufacturing process, and variations in the operating temperature and power supply voltage. CMOS integrated circuits typically have a variation of about three in speed between the worst-case fast (WCF) and worst-case slow (WCS) conditions. The effect of this variation on output buffers, especially transistor-transistor logic (TTL) level buffers, is that when the buffer is sized for a certain maximum propagation delay at WCS conditions, it is about three times faster at WCF. This makes it so fast that the high rate that it switches current through the package inductance, L, generates a large voltage equal to $L \times (di/dt)$. When the buffer output rises, the effect is to cause the power supply voltage ($V_{DD}$) to dip below its normal value. When the output falls, the effect is to cause $V_{SS}$ to rise above its normal value, which is called "ground bounce". In practice, it is this second case that causes the most problems on TTL buffers. The TTL threshold of 1.5 volts is far enough below $V_{DD}/2$ so that the N-channel output device must be much larger than the P-channel to obtain equal rise and fall propagation delays. Also the 1.5 volt threshold makes TTL input buffers much more susceptible to $V_{SS}$ bounce than to $V_{DD}$ bounce. If $V_{SS}$ (nominally ground) rises above about 1.5 volts at a TTL input which is held at 2 volts (minimum VIL specification), the input buffer will glitch. Still other noise problems are possible due to excessively fast rise and/or fall times of the output buffer.

Attempts to automatically control ground bounce typically rely on creating analog control voltages which vary the magnitude of the drive signal on the gates of the output transistors. For example, one such technique is shown in U.S. Pat. No. 4,823,029, and another is shown in U.S. Pat. No. 5,017,807, both co-assigned herewith. Although successful in many applications, these analog control voltages are typically generated by circuits whose modeling depends on the accuracy of the modeling of the manufacturing process. In many cases, this modeling is not accurate enough to produce reliable control voltages, especially when changes in the manufacturing process occurs. Also, the analog control voltages being bussed around the chip can be influenced by local noisy signals as they cross over the conductors carrying them. Another technique is to include an additional pull-down (or pull-up) output transistor for sinking (or sourcing) additional output current. The additional transistor is activated when the voltage on the buffer output node passes a given threshold; see, for example, U.S. Pat. No. 5,097,148 co-assigned herewith.

SUMMARY OF THE INVENTION

I have invented a buffer control technique wherein digital control signals are used to activate switching transistors in a buffer having at least two transistors capable of being independently activated. The digital control signals are provided by an analog-to-digital (A/D) converter that receives an analog reference signal that is responsive to factors affecting buffer switching speed, typically including manufacturing process variations, operating temperature, and power supply voltage. The A/D converter preferably has a number of comparators corresponding to a number of analog voltage levels. The analog reference signal in a preferred embodiment is generated by a reference transistor having the same conductivity type (e.g., N-type) as the buffer output transistor, and having the same gate-to-source voltage in the saturated "on" state. The buffer transistors thus controlled may be conveniently implemented by a multiple-drain transistor having separate gates and a common source.

BRIEF DESCRIPTION OF THE DRAWINGS

FIG. 1 shows a illustrative control circuit, including an analog reference voltage generator and analog-to-digital converter, that may be used in implementing the invention.

FIG. 2 shows an alternative control circuit that may be used in implementing the invention.

DETAILED DESCRIPTION

Figure 3:
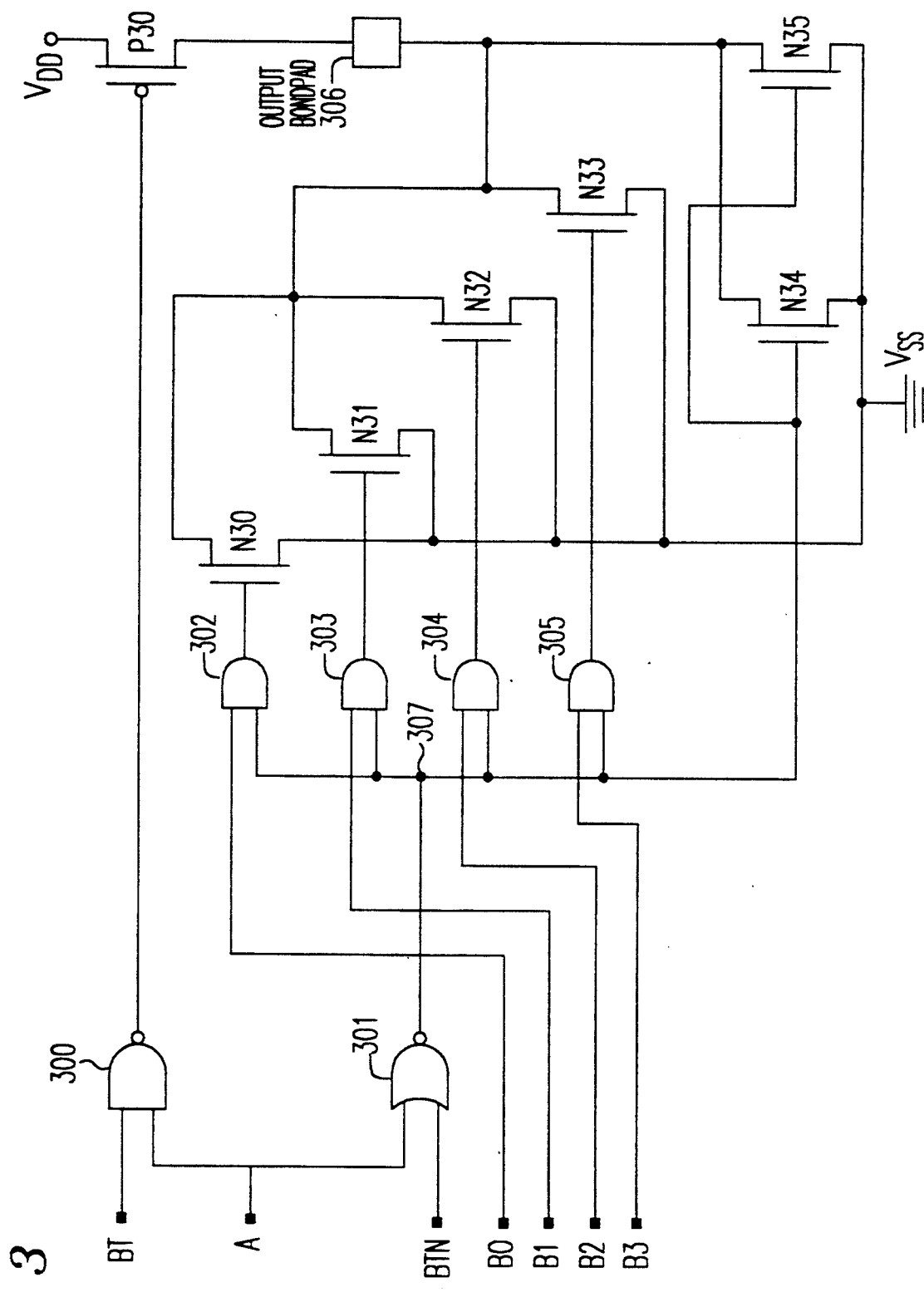
FIG. 3 shows an illustrative embodiment of the invention.

The following detailed description relates to a technique for controlling the switching speed of a buffer by means of digital control signals. In a preferred embodiment of the invention, an analog reference signal is generated which is directly proportional to the strength of the controlled buffer output transistor, which is an N-channel pull-down transistor in the illustrative case. The analog reference voltage is provided to the input of an A/D converter, which generates digital control signals. The digital control signals then activate one or more buffer output transistors, which are typically independently-controllable segments of a multiple-drain output transistor. That is, the source electrodes are connected to a first common node, and similarly the drain regions are connected to a second common node. However, the gate electrodes are electrically isolated, to allow for independent control of the segments.

Referring to FIG. 1 an illustrative embodiment of a circuit suitable for generating the digital control signals from an analog signal is shown. In order to generate the analog reference signal, reference transistor N10 is biased into saturation. Since N10 is N-channel, it accurately tracks changes in the N-channel pull-down transistors due to variations in the manufacturing process, operating temperature, and power supply voltage. The saturation current of N10, ($I_{on}$) is mirrored into resistor 101 by means of current-mirror transistors P10 and P11. If a well controlled resistor (e.g., plus or minus 5% or better) is available, the resistor 101 may be made be on-chip. However, typically an external resistor is used, and connected to bondpad 100, in order to obtain the desired tolerance. Typical values of resistor 101 are in the range of from 100 ohms to 10 kilohms.

The analog reference voltage generated, $V_{refn}$, is applied to an A/D converter, which in the illustrative case is a four-level design providing four digital output signals (B0-B3). The A/D converter includes comparators 107, 108, 109 and 110, all of which can readily be made on-chip. The A/D converter includes means for generating a reference voltage supplied to each comparator. In a typical case, the reference voltages are obtained from a resistor divider network, illustratively comprising resistors 102, 103, 104, 105 and 106. These are connected to $V_{DD}$ in the illustrative case. Alternatively, they may be connected to a reference voltage if one is available. Nodes D0, D1, D2 and D3 of the resistor network are connected to the non-inverting (+) inputs of comparators 107, 108, 109 and 110, respectively. The resistor dividers are chosen such that at WCS conditions (minimum $I_{on}$), $V_{refn}$ is below node D3, so that all four comparators have high outputs. As the process/temperature/voltage changes so that $I_{on}$ increases, voltage $V_{refn}$ also increases. This increases the voltage at the inverting (−) input of the comparators, which successively causes B3 through B0 to go to the low voltage state (e.g., $V_{SS}$), in that order. In many cases, it is desirable to include a certain amount of hysteresis to the comparators in the A/D converter, to minimize "hunting" due to small changes in the temperature or power supply voltage. This may be accomplished according to techniques well known in the art.

The control voltages B0-B3 are used to control the number of active transistors in the buffer, as shown in one embodiment in FIG. 3. The output buffer is tri-statable in the design shown, although that is optional insofar as the present invention is concerned. The illustrative output buffer has a P-channel pull-up device (P30). The pull-down device comprises six parallel N-channel source/drain "fingers", whose gate electrodes are all logically coupled to node 307. However, in the embodiment shown, only two of the N-channel gates are connected directly to node 307. The others are connected to node 307 via AND gates 302, 303, 304 and 305. These AND gates are controlled by the digital control signals B0-B3. A buffer connected in this way will have all four AND gates active under WCS conditions, since B0, B1, B2 and B3 are all high in this case. Therefore, all six of the transistors N30-N35 are active, and serve to pull down the output node (bondpad 306) when the input to the buffer (A) goes low. However, the buffer will have only two N-channel pull-down transistors (N34, N35) active at WCF conditions, since B0-B3 are all low in this case. When the variations in the manufacturing process and operating conditions are between WCS and WCF, then an intermediate number of pull-down transistors (N30, N31, N32, N33) are active, in addition to N34 and N35. The signal BT at the input of NAND gate 300, and its complement BTN at the input to the NOR gate 301, places the buffer in the tri-state condition when BT is low (and hence BTN is high). Conversely, when BT is high (and BTN low), the buffer is active.

One advantage of the inventive technique is that the control leads are digital, and thus not as susceptible to noise as a lead carrying an analog control signal. Therefore, the present invention makes more feasible the use of a single control circuit (e.g., FIG. 1) that provides digital signals (e.g., B0-B3) that may be routed around a chip full of noisy signals, in order to control multiple buffers (e.g., FIG. 3). These digital signals may optionally be latched, and the control circuit powered down to zero for power-sensitive applications. The latches and control circuit could then be clocked periodically (e.g., every few milliseconds) to provide for updating the control signals for tracking changes in temperature and/or power supply voltage. Another advantage of the control circuit shown in FIG. 1 is that it is reasonably independent of process variation and/or process model inaccuracy. This is because the only parameter used in the exemplary control circuit ($I_{on}$), is the same one that governs the speed with which the buffer pulls down a capacitive load, so that they are forced to track each other.

Other circuits may be used in lieu of that shown in FIG. 1 for generating the analog reference signal that is provided to the A/D converter. For example, the circuit of FIG. 2 eliminates the current mirror, and the current $I_{on}$ through N20 hence provides for generating the control voltage $V_{refn}$ directly, through reference resistor 201. The drain of the reference transistor N20 is connected directly to the non-inverting (+) input of comparators 207, 208, 209 and 210. The voltage-divider resistors 202 to 206 have comparable functions as before. Note that in FIG. 1 and FIG. 2, the reference transistor (N10, N20) has its gate connected to $V_{DD}$, and its source connected to $V_{SS}$. Hence, its performance directly tracks that of the buffer output transistors (N30-N35) being controlled. That is, the current $I_{on}$ is the directly proportional to the drain current through the buffer output transistors when the gate voltage is high, and these output transistors are operating in saturation. The constant of proportionality depends on the relative sizes of the output transistors to the analog reference transistor.

In contrast, prior-art circuits use a transistor of one conductivity type (e.g., P-type) to at least partially generate the analog control signal to a buffer output transistor of the opposite conductivity type (e.g., N-type). That provides adequate tracking of process speed, temperature, and power supply voltage changes in some cases. However, the preferred embodiment of the present technique, by using a transistor of a given conductivity type to generate the analog reference signal to control a buffer output transistor of the same conductivity type, provides improved accuracy.

The A/D converter shown in the above embodiment appears similar to the "flash" type, wherein a separate comparator is used for each of the levels, being four in the illustrative case. However, flash A/D converters as known in the art are typically used to provide high speed operation. In contrast, in the present application, the comparators (107-110; 207-210) are typically made to be very slow, which allows for a small, space-saving design. While a four-level A/D converter is shown, any desired number of levels (i.e., two or more) may be used, producing a corresponding number of digital output signals. I have determined that when providing from two to around twelve output levels (with a corresponding number of comparators), the above design requires less space for implementation that other designs. Furthermore, I have determined that good control of the buffer switching speed may be obtained with a design that includes from two to twelve levels, and hence two to twelve controlled switching transistor elements. While still more levels are possible for control of still more switching transistor elements, the space required for the logic gates and conductors to the gates of the switching transistor elements increases to beyond a practical size at some point.

The inventive buffer typically drives a bondpad 306 connected to an external load. However, it may alternatively drive a load internal to the same integrated circuit on which the buffer is formed. For example, a clock driver circuit may benefit from the use of the inventive technique, and is considered a "buffer" as used herein. The inventive technique also has the advantage that it is easily adapted to the layout of typical buffers. That is, buffer output transistors usually have multiple source/- drain fingers in order to increase their current drive capability. The inventive technique may then be readily implemented by separately controlling the gate electrode of each finder. In that case, the size of the output transistor need not significantly increase when adopting the present invention. Furthermore, the additional AND gates shown in FIG. 3 may be relatively small. Although the control of the N-channel pull-down transistor is shown in the above embodiment, the P-channel pull-up transistor may be similarly controlled in addition to, or in lieu of, the pull-down device. The control circuitry may then be similar to that shown in FIG. 1 (or alternatively FIG. 2), with the conductivity types of the transistors opposite to that shown, and power supply connections to the opposite voltages as shown. The logic gates are then more conveniently NAND gates rather than the AND gates (302-305) shown in FIG. 3.

In some cases, the pull-up transistor is N-channel, and may be controlled by the present technique. The present technique may also be used where only a pull-down transistor (or alternatively only a pull-up transistor) is used in the buffer, with a resistor or other passive device providing the pull-up toward the high voltage level (or alternatively pull-down toward the low voltage level). Finally, while the above embodiment is shown for CMOS circuitry, application to NMOS, PMOS, and bipolar circuitry is evident, and included herein.

I claim:

1. An integrated circuit comprising a buffer output device of a given conductivity type for pulling a node toward a given voltage level, and means for controlling the switching speed of said device to compensate for variations in at least one of the factors of: manufacturing process, operating temperature, and power supply voltage;

Characterized in that said means for controlling the speed comprises:

a reference device of said given conductivity type for generating an analog reference signal that tracks the effect of at least one of said factors on said switching speed, and an analog-to-digital converter comprising at least two comparators that receive said analog reference signal, compare said analog reference signal to fixed reference voltages, and produce digital control signals thereby;

and wherein said buffer output device comprises independently-controllable switching elements that are rendered active, or alternatively inactive, by said digital control signals.

2. The integrated circuit of claim 1 wherein said fixed reference voltages are provided by a resistor divider network.

3. The integrated circuit of claim 1 wherein said buffer output device is an N-channel field effect transistor that is used to pull-down the voltage on said node, and said reference device is an N-channel field effect transistor.

4. The integrated circuit of claim 1 wherein said buffer output device is a field-effect transistor having multiple source/drain regions that are independently-controllable by means of multiple gate electrodes.

5. The integrated circuit of claim 1 wherein said reference device is a reference transistor of said given conductivity type having a source connected to a first power supply voltage conductor, a gate connected to a second power supply voltage conductor, and a drain connected to the drain and gate of a first mirror transistor of the opposite conductivity type, wherein said first mirror transistor has a source connected to said second power supply voltage conductor; and further comprising a second mirror transistor of said opposite conductivity type having a source connected to said second power supply voltage conductor, a gate connected to the gate of said first mirror transistor, and a drain connected to a reference resistor that is connected to said first power supply voltage conductor;

wherein the analog reference signal is produced at the connection of the drain of said second mirror transistor and said reference resistor.

6. The integrated circuit of claim 1 wherein said reference device is a reference transistor of said given conductivity type having a source connected to a first power supply voltage conductor, a gate connected to a second power supply voltage conductor, and a drain connected to a reference resistor that is connected to said second power supply voltage conductor;

wherein the analog reference signal is produced at the connection of the drain of said reference transistor and said reference resistor.

7. An integrated circuit comprising a buffer output field effect transistor of a given conductivity type for pulling a buffer output node toward a first power supply voltage conductor, and means for controlling the switching speed of said transistor to compensate for variations in at least one of the factors of: manufacturing process, operating temperature, and power supply voltage;

Characterized in that said means for controlling the speed comprises:

a reference field effect transistor of said given conductivity type for generating an analog reference signal that tracks the effect of at least one of said factors on said switching speed, and an analog-to-digital converter that receives said analog reference signal and produces digital control signals therefrom;

wherein said reference field effect transistor of said given conductivity type has a gate connected to a power supply voltage conductor for causing a saturation drain current to flow that is proportional to the saturation drain current through said buffer output field effect transistor;

and wherein said buffer output field effect transistor comprises multiple source/drain regions that are independently-controllable by means of multiple gate electrodes, whereby portions of said transistor are rendered active, or alternatively inactive, by said digital control signals.

8. The integrated circuit of claim 7 wherein said reference field effect transistor has its source connected to said first power supply voltage conductor, and its gate connected to a second power supply voltage conductor.

9. The integrated circuit of claim 8 wherein said reference field effect transistor has its drain connected to the drain and gate of a first mirror transistor of the opposite conductivity type, wherein said first mirror transistor has a source connected to said second power supply voltage conductor, and its drain and gate connected to the gate of a second mirror transistor of said opposite conductivity type;

with said second mirror transistor having a source connected to said second power supply voltage conductor and a drain connected to a reference resistor that is connected to said first power supply voltage conductor; and wherein the analog reference signal is produced at the connection of the drain of said second mirror transistor and said reference resistor.

10. The integrated circuit of claim 8 wherein said reference field effect transistor has its drain connected to a reference resistor that is connected to said second power supply voltage conductor;

wherein the analog reference signal is produced at the connection of the drain of said reference transistor and said reference resistor.

11. The integrated circuit of claim 7 wherein said given conductivity type is N-type, said first power supply voltage conductor is a ground voltage ($V_{SS}$) conductor, and said second power supply voltage conductor is a positive voltage ($V_{DD}$) conductor.

12. The integrated circuit of claim 7 wherein said given conductivity type is P-type, said first power supply voltage conductor is a positive voltage ($V_{DD}$) conductor, and said second power supply voltage conductor is a ground voltage ($V_{SS}$) conductor.

13. An integrated circuit comprising an N-channel buffer output field effect transistor for pulling a buffer output node toward a ground voltage level ($V_{SS}$), and means for controlling the switching speed of said transistor to compensate for variations in at least one of the factors of: manufacturing process, operating temperature, and power supply voltage;

Characterized in that said means for controlling the speed comprises:

a reference N-channel field effect transistor for generating an analog reference signal that tracks the effect of at least one of said factors on said switching speed, said reference transistor having its source connected to a ground power supply voltage conductor ($V_{SS}$), and its gate connected to a positive power supply voltage conductor ($V_{DD}$);

and further comprises an analog-to-digital converter that receives said analog reference signal and produces digital control signals therefrom, said converter comprising at least two comparators that receive said analog reference signal at a first comparator input, and a reference voltage at a second comparator input;

and wherein said buffer output field effect transistor comprises multiple source/drain regions that are independently-controllable by means of multiple gate electrodes, whereby portions of said transistor are rendered active, or alternatively inactive, by said digital control signals.

14. The integrated circuit of claim 13 wherein said reference N-channel field effect transistor has its drain connected to the drain and gate of a first P-channel mirror transistor;

wherein said first P-channel mirror transistor has a source connected to said positive power supply voltage conductor, and its drain and gate connected to the gate of a second P-channel mirror transistor;

and with said second P-channel mirror transistor having a source connected to said positive power supply voltage and a drain connected to a reference resistor that is connected to said ground power supply voltage;

wherein the analog reference signal is produced at the connection of the drain of said second P-channel mirror transistor and said reference resistor.

15. The integrated circuit of claim 13 wherein said reference N-channel field effect transistor has its drain connected to a reference resistor that is connected to said positive power supply voltage conductor;

wherein the analog reference signal is produced at the connection of the drain of said reference N-channel transistor and said reference resistor.

* * * * *